(12) United States Patent
Liu et al.

(10) Patent No.: US 8,072,777 B2
(45) Date of Patent: Dec. 6, 2011

(54) LABEL ASSEMBLY AND CIRCUIT BOARD USING THE SAME

(75) Inventors: Lei Liu, Shenzhen (CN); Zheng-Heng Sun, Taipei Hsien (TW)

(73) Assignees: Hong Fu Jin Precision Industry (ShenZhen) Co., Ltd., Shenzhen, Guangdong Province (CN); Hon Hai Precision Industry Co., Ltd., Tu-Cheng, New Taipei (TW)

( * ) Notice: Subject to any disclaimer, the term of this patent is extended or adjusted under 35 U.S.C. 154(b) by 385 days.

(21) Appl. No.: 12/409,527

(22) Filed: Mar. 24, 2009

(65) Prior Publication Data

US 2010/0181103 A1    Jul. 22, 2010

(30) Foreign Application Priority Data

Jan. 16, 2009    (CN) .......................... 2009 1 0300227

(51) Int. Cl.
*H05K 7/00* (2006.01)

(52) U.S. Cl. ........ 361/807; 101/38.1; 385/137; 351/246

(58) Field of Classification Search ................. 104/17.2; 101/38.1, 35, 93.11; 348/376; 174/262, 174/250; 385/135, 137, 37; 351/244, 245, 351/246; 361/679.21, 679.09, 679.01, 679.11
See application file for complete search history.

(56) References Cited

U.S. PATENT DOCUMENTS

| 6,202,550 B1 * | 3/2001 | Lee et al. .............. 101/38.1 |
| 7,467,871 B2 * | 12/2008 | Lawhorn et al. ........... 351/245 |
| 2006/0077287 A1 * | 4/2006 | Koshu et al. ............ 348/376 |

FOREIGN PATENT DOCUMENTS

| CN | 2243108 Y | 12/1996 |
| CN | 200986775 Y | 12/2007 |

\* cited by examiner

*Primary Examiner* — Hung Duong
(74) *Attorney, Agent, or Firm* — Altis Law Group, Inc.

(57) ABSTRACT

A label assembly includes a support and a label body. The label body is configured to allow a label to be attached thereto. The support includes an upright post, and a fixing portion formed at a distal end of the post opposite to the label body. The fixing portion is configured to removably attach the label assembly to a circuit board. A circuit board supporting the label assembly is further provided.

6 Claims, 8 Drawing Sheets

LABEL ASSEMBLY AND CIRCUIT BOARD USING THE SAME

BACKGROUND

1. Technical Field

The disclosure relates to a label assembly and a circuit board using the label assembly.

2. Description of Related Art

On a circuit board, such as a computer motherboard, a plurality of labels recording and providing information of the circuit board is attached. However, the plurality of labels, often including bar codes, part numbers, product identities, media access control addresses, and others, occupy a great deal of blank area of the circuit board, which inhibits current trends toward circuit board size reduction and density maximization.

DETAILED DESCRIPTION

Figure 1:
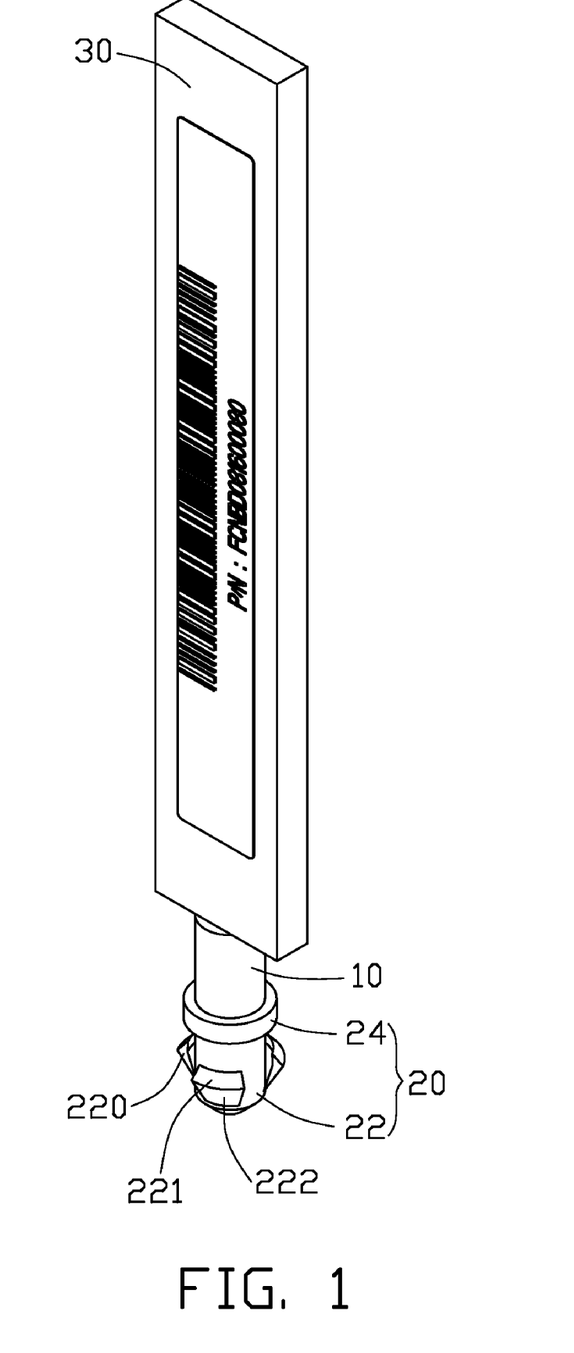
FIG. 1 is an isometric view of a first embodiment of a label assembly.
Figure 2:
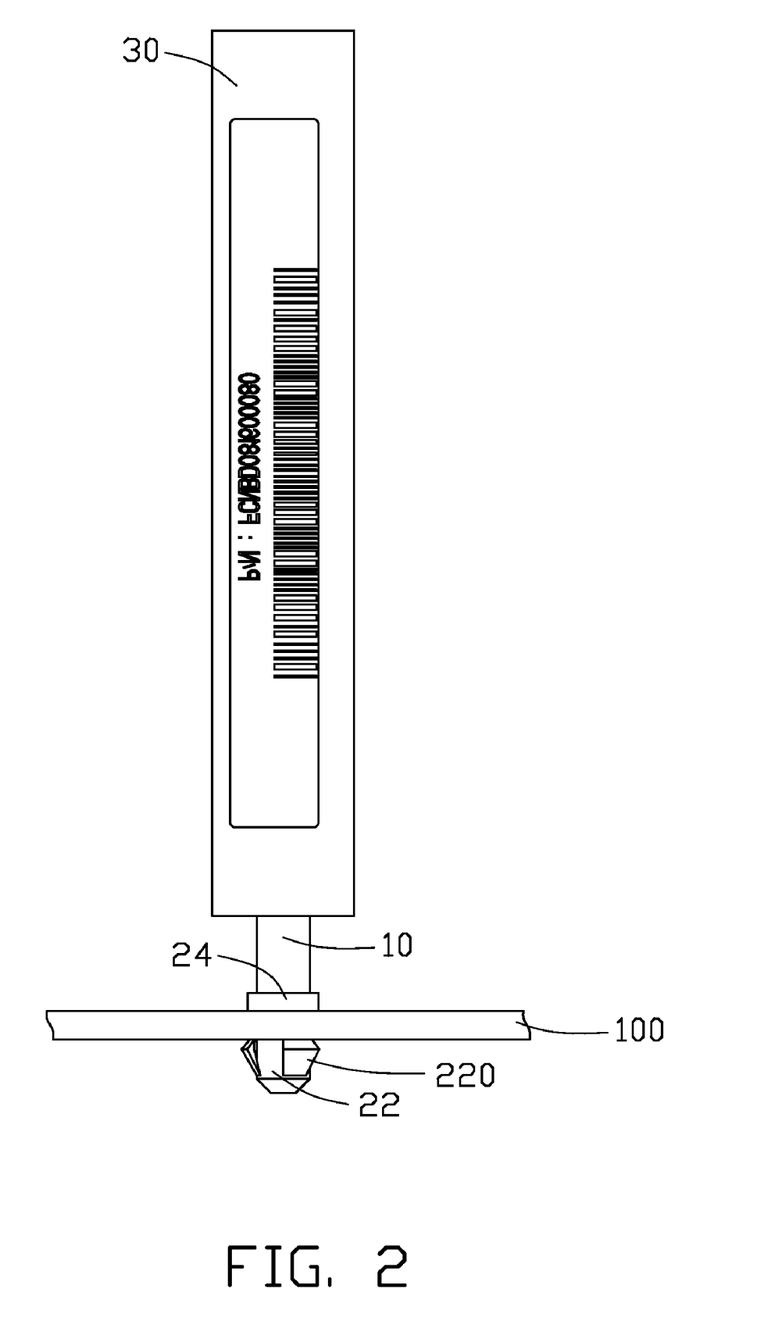
FIG. 2 is an assembled, side view of the label assembly of FIG. 1 applied on a circuit board, according to the disclosure.

Referring to FIGS. 1 and 2, a first embodiment of a label assembly includes a lateral label body 30 and a support extending from a bottom of the label body 30. The support includes an upright post 10 and a fixing portion 20 formed at a distal end of the post 10. Here, the label body 30 is a lengthwise plate. The fixing portion 20 includes a fastener 22 located at the distal end of the post 10, and a ring 24 extending from a circumference of the post 10 and positioned between the fastener 22 and the label body 30. The fastener 22 includes a plurality of wedge-shaped projections 220 extending from a circumference of the distal end of the post 10. Each projection 220 includes an upper surface 221 facing the ring 24 and angled relative to the post 10, and a lower surface 222 opposite to the ring 24 and angled relative to the post 10.

In manufacture, one or more labels may be applied to the label body 30, or formed on the label body 30 via a printing process, such as a silk-screen process.

In use, the fastener 22 of the label assembly is received in a through hole defined in a circuit board 100, through which the projections 220 pass. Thus, the circuit board 100 is sandwiched between the projections 220 and the ring 24. During disassembly, the label assembly can be manually withdrawn. The angled upper surface 221 and the angled lower surface 222 allow ease of withdrawal or insertion of the label assembly.

Figure 3:
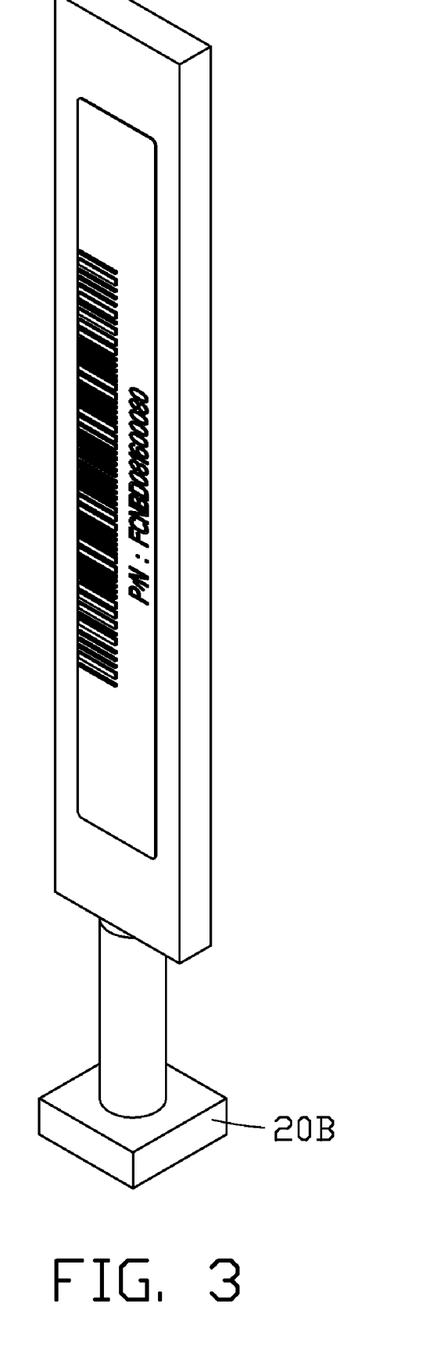
FIG. 3 is an isometric view of a second embodiment of a label assembly.

Referring to FIG. 3, a second embodiment of a label assembly is shown, differing from the embodiment in FIG. 1 only in a fixing portion 20B of the label assembly of the second embodiment being brick-shaped. The fixing portion 20B is fixed to a circuit board via a bottom of the fixing portion 20B applied to the circuit board.

Figure 4:
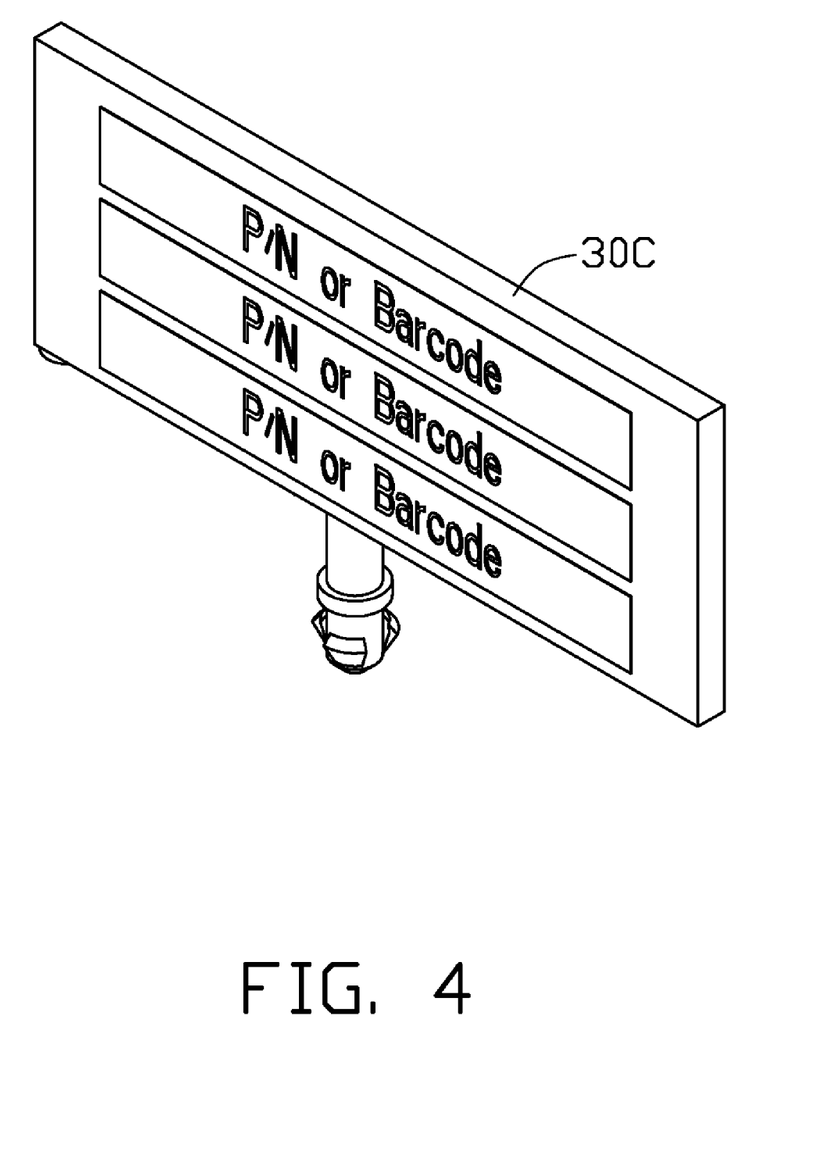
FIG. 4 is an isometric view of a third embodiment of a label assembly.

Referring to FIG. 4, a third embodiment of a label assembly is shown, differing from the embodiment in FIG. 1 only in that the label body 30C of the label assembly of the third embodiment is a laterally disposed plate.

Figure 5:
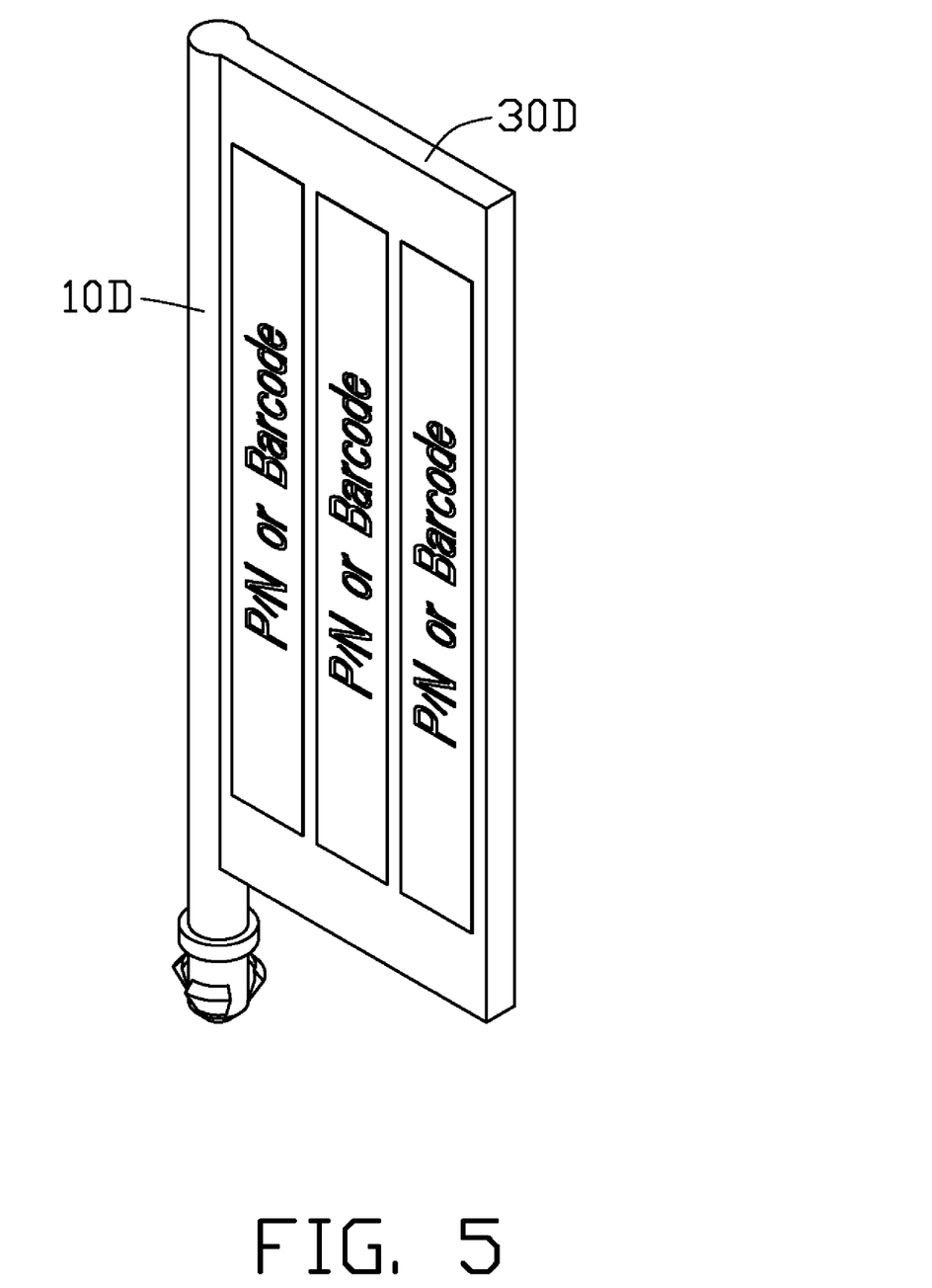
FIG. 5 is an isometric view of a fourth embodiment of a label assembly.

Referring to FIG. 5, a fourth embodiment of a label assembly is shown, differing from the embodiment in FIG. 1 only in that a label body 30D of the label assembly of the fourth embodiment extends from a side of a post 10D of the label assembly.

Figure 6:
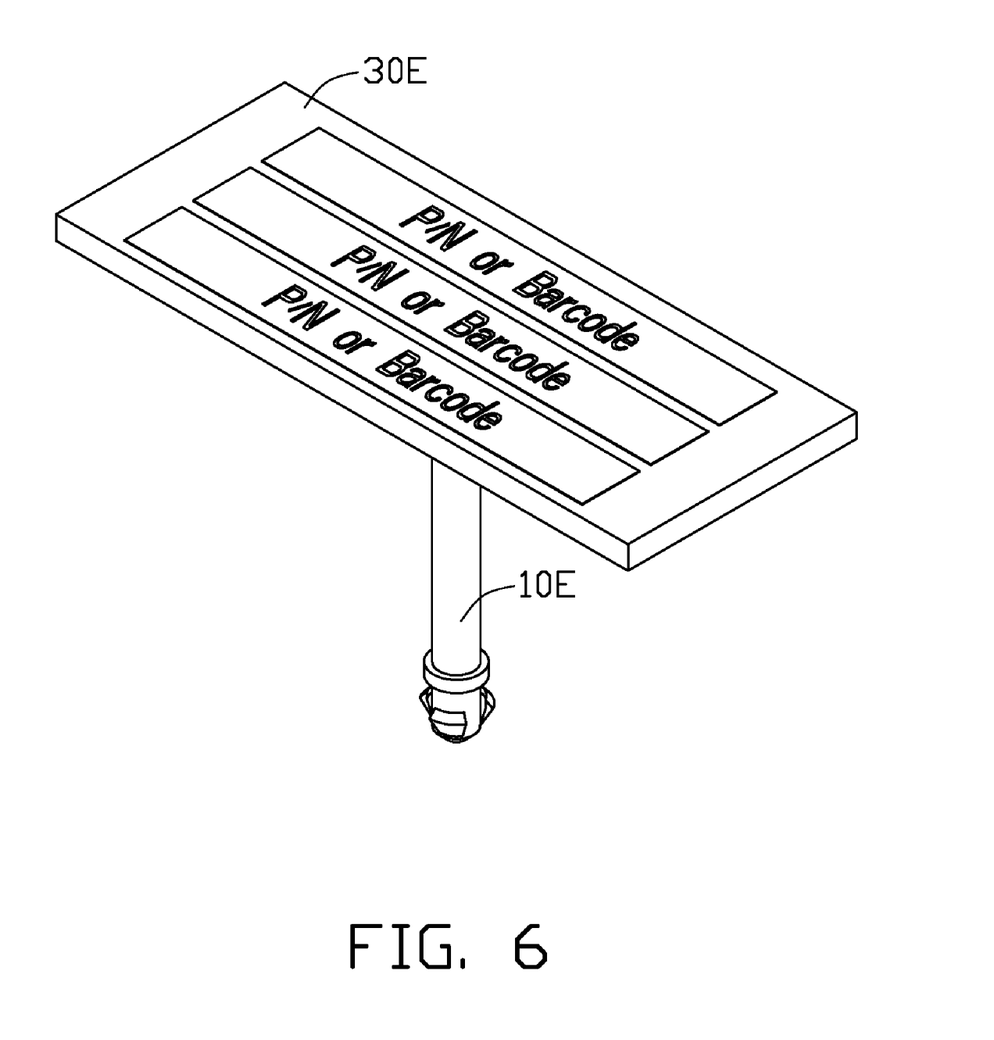
FIG. 6 is an isometric view of a fifth embodiment of a label assembly.

Referring to FIG. 6, a fifth embodiment of a label assembly is shown, differing from the embodiment in FIG. 1 only in that a label body 30E of the label assembly of the fourth embodiment is horizontally supported on a top of a post 10E of the label assembly.

Figure 7:
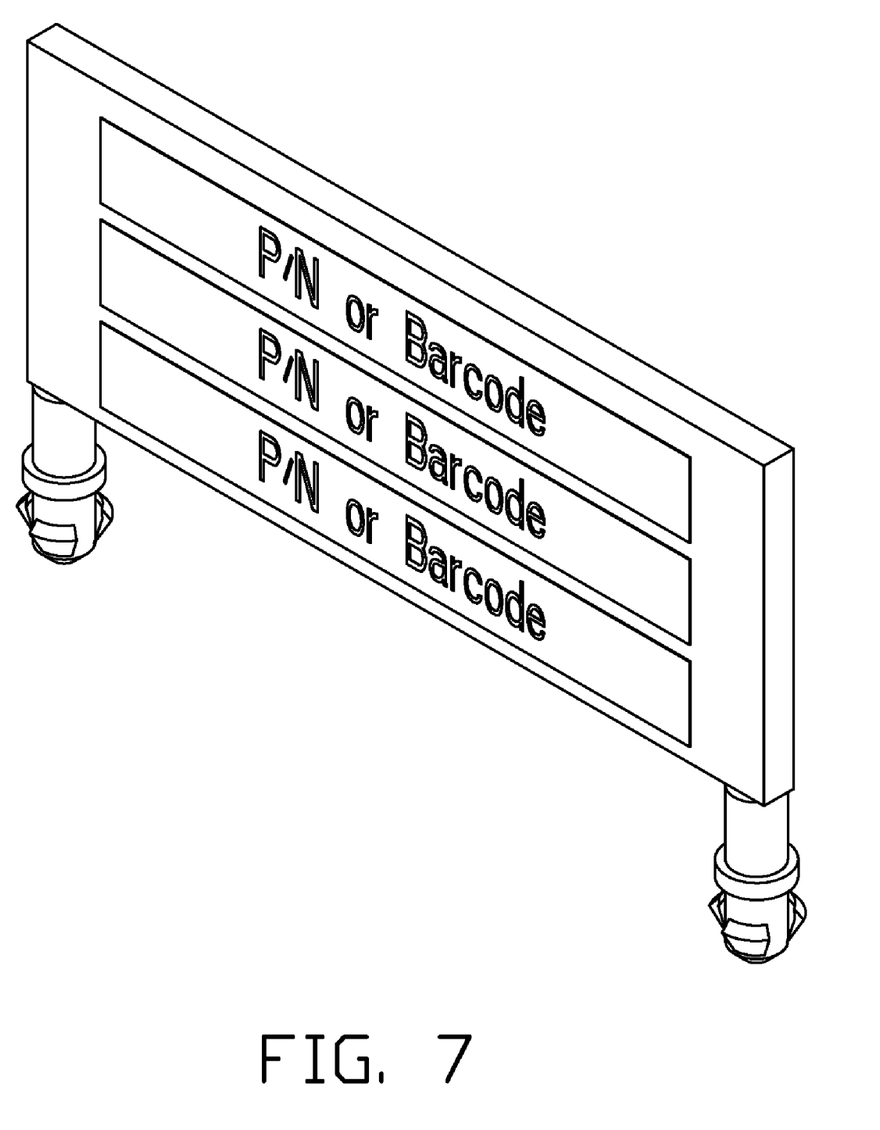
FIG. 7 is an isometric view of a sixth embodiment of a label assembly.

Referring to FIG. 7, a sixth embodiment of a label assembly is shown, differing from the embodiment in FIG. 4 only in that the label assembly of the sixth embodiment includes two supports depending from opposite ends of a bottom of a label body of the label assembly.

Figure 8:
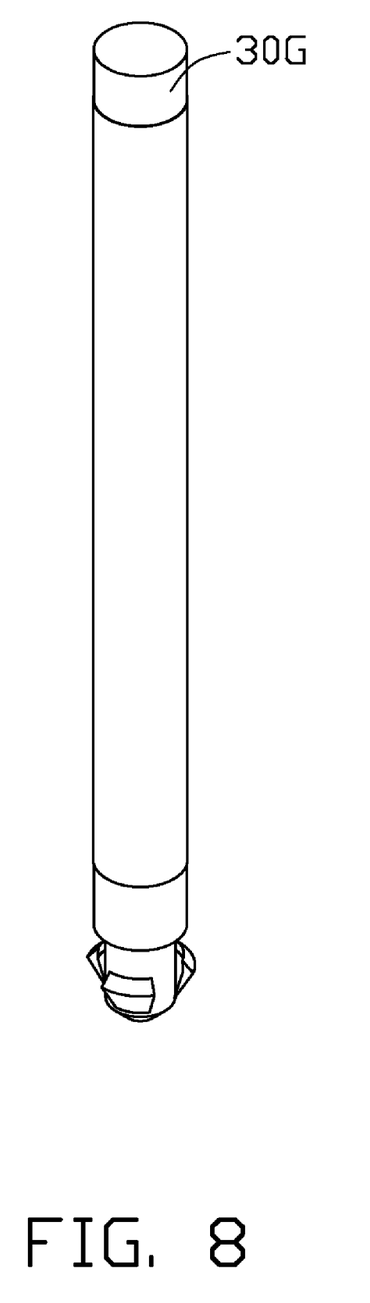
FIG. 8 is an isometric view of a seventh embodiment of a label assembly.

Referring to FIG. 8, a seventh embodiment of a label assembly is shown, differing from the embodiment in FIG. 1 only in that the label body 30G of the label assembly of the seventh embodiment is cylindrical. Labels can be attached to a circumference of the label body 30G.

The label assemblies as disclosed provide effective use of space on the circuit board, allowing size reduction or increased population thereof, and reusable label assemblies.

It is to be understood, however, that even though numerous characteristics and advantages of the disclosure have been set forth in the foregoing description, together with details of the structure and function of the disclosure, the disclosure is illustrative only, and changes may be made in detail, especially in matters of shape, size, and arrangement of parts within the principles of the disclosure to the full extent indicated by the broad general meaning of the terms in which the appended claims are expressed.

What is claimed is:

1. A label assembly comprising:
    a label body contoured to receive at least one label attached thereon; and
    a support configured to support the label body, wherein the support comprises an upright post, and a fixing portion formed at a distal end of the post opposite to the label body, the fixing portion comprises a fastener at the distal end of the post, and a ring extending from a circumference of the post, with the ring located between the fastener and the label body, to sandwich the circuit board together with the fastener, the fixing portion configured to removably attach the label assembly to a circuit board, the fastener comprises a plurality of projections extending from a circumference of the post, each of the plurality of projections comprises an upper surface facing the label body and angled relative to the post, and a lower surface opposite to the label body and angled relative to the post.

2. The label assembly of claim 1, wherein the at least one label is formed on the label body via a printing process.

3. The label assembly of claim 1, wherein the at least one label is formed on the label body via a silk-screen process.

4. The label assembly of claim 1, wherein the fixing portion is brick-shaped having a bottom portion being attached to the circuit board to fix the fixing portion to the circuit board.

5. The circuit board assembly of claim 4, wherein each of the projections comprises an upper surface facing the label body and angled relative to the post to assist withdrawal of the fastener from the through hole.

6. A circuit board assembly comprising:
a circuit board; and
a label assembly comprising a support, and a label body with at least one label being attached thereto;
wherein the support comprises an upright post, and a fixing portion formed at a distal end of the post opposite to the label body, the fixing portion adapted to removably attach the label assembly to a circuit board, the fixing portion comprises a fastener adapted to engage in a through hole of the circuit board and a ring extending from a circumference of the post, the ring located between the fastener and the label body, a plurality of projections extends from a circumference of the post, and wherein the circuit board is sandwiched between the projections and the ring, each of the projections comprises a lower surface opposite to the label body and angled relative to the post to assist the fastener to engage in the through hole.

* * * * *